US006531234B1

(12) United States Patent
Higashi et al.

(10) Patent No.: US 6,531,234 B1
(45) Date of Patent: *Mar. 11, 2003

(54) ORGANIC ELECTROLUMINESCENCE DEVICE AND METHOD OF ITS MANUFACTURE

(75) Inventors: Hisahiro Higashi, Sodegaura (JP); Toshio Sakai, Sodegaura (JP); Chishio Hosokawa, Sodegaura (JP)

(73) Assignee: Idemitsu Kosan Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/508,663
(22) PCT Filed: May 9, 2000
(86) PCT No.: PCT/JP99/03810
 § 371 (c)(1),
 (2), (4) Date: Mar. 22, 2000
(87) PCT Pub. No.: WO00/05927
 PCT Pub. Date: Feb. 3, 2000

(30) Foreign Application Priority Data

Jul. 24, 1998 (JP) .......................................... 10-209748
Mar. 11, 1999 (JP) .......................................... 11-065090

(51) Int. Cl.$^7$ ............................ H05B 33/00; B05D 5/06

(52) U.S. Cl. ....................... 428/690; 428/917; 313/502; 313/503; 313/506; 252/301.34; 427/69; 427/685

(58) Field of Search ................................ 428/690, 917; 313/502, 503, 506; 252/301.34; 427/585, 69

(56) References Cited

U.S. PATENT DOCUMENTS

| | | | |
|---|---|---|---|
| 5,503,910 A | 4/1996 | Matsuura et al. ........... | 428/212 |
| 5,904,961 A | * 5/1999 | Tang et al. ................. | 427/561 |
| 6,001,284 A | * 12/1999 | Enokida et al. ............. | 252/583 |

* cited by examiner

Primary Examiner—Cynthia H. Kelly
Assistant Examiner—Dawn Garrett
(74) Attorney, Agent, or Firm—Oblon, Spivak, McClelland, Maier & Neustadt, P.C.

(57) ABSTRACT

The present invention relates to a practical organic EL element which is excellent in a durability without decreasing a luminance even in the driving for a long period of time and which is appropriately used in, for example, a display of information appliances or the like, a process for producing the same, and further an organic EL film. It is an organic electroluminescence element in which an organic compound layer having at least an organic emitting layer is held between a pair of electrodes, an anode and a cathode, an intensity of a main peak and an intensity of each sub-peak in a mass spectrum of at least one layer of the organic compound layer satisfying a specific relationship.

4 Claims, No Drawings

ORGANIC ELECTROLUMINESCENCE DEVICE AND METHOD OF ITS MANUFACTURE

TECHNICAL FIELD

The present invention relates to an organic electroluminescence element (electroluminescence is hereinafter abbreviated as "EL"). More specifically, it relates to an organic EL element which is excellent in a durability without decreasing a luminance even in the driving for a long period of time, and a process for producing the same.

BACKGROUND OF THE INVENTION

An EL element using electroluminescence has characteristics that for its emission, the visibility is high and since it is a complete solid state element, the impact strength is excellent. Accordingly, its use as a luminescence element in various display devices has attracted much interest.

The EL elements include an inorganic EL element obtained by using an inorganic component as a emitting material and an organic EL element obtained by using an organic compound as a emitting material. Especially the organic EL element of these can much reduce an applied voltage, is easy to downsize, reduces consumption power, allows area luminescence and also easily emits luminescence of three primary colors. Accordingly, studies have positively been made to put the same to practical use as a luminescence element in the next generation.

With respect to the construction of this organic EL element, an element based on a construction of anode/ organic emitting layer/cathode and provided on this with a hole injecting and transporting layer or an electron injection layer as required, for example, an element having a construction of anode/hole injecting and transporting layer/ organic emitting layer/cathode, anode/hole injecting and transporting layer/organic emitting layer/electron injection layer/cathode or the like has been known.

The greatest problem in the studies to put such an organic EL element to practical use is to establish a technology in which an organic EL element can hold the practical quality by controlling the decrease in its luminance accompanied by the driving for a long period of time.

In this respect, according to *Gekkan Display*, September, p. 15 (1995) and *Oyo Butsuri*, vol. 66, No. 2, pp. 114–115 (1997), it is known that the purity of various organic compounds used to produce electric EL elements strongly influences the decrease in a emitting efficiency and a luminance. However, the influence of the structures, qualities and the like of various organic compounds used in organic EL elements on properties of organic EL elements has not been clarified yet, and a method for quantitatively measuring the same has been unknown.

Accordingly, when organic EL elements are used for a long period of time, the details of the reasons for decreasing the luminance have been currently unknown.

Further, especially in recent years, there have been a large number of examples in which an anthracene skeleton, a naphthacene skeleton, a pyrene skeleton or a perylene skeleton is used in a hole transport-injection material, a emitting material and a doping material. However, these skeletons are characterized in that they are easily oxidized, and a technology of controlling the oxidized compound has not been developed yet.

DISCLOSURE OF THE INVENTION

Under these circumstances, the present invention aims to provide a practical organic EL element which is excellent in a durability without decreasing a luminance even in the driving for a long period of time, a process for producing the same, and further an organic electroluminescence film.

The present invention aims to, among others, especially a practical organic EL element which is excellent in a durability without decreasing a luminance even in the driving for a long period of time, when using a material having an anthracene skeleton, a naphthacene skeleton, a pyrene skeleton or a perylene skeleton in an organic EL element, a process for producing the same, and further an organic electroluminescence film.

The present inventors have assiduously conducted investigations to develop an organic EL element excellent in a durability, and have consequently found that when at least one layer of an organic compound layer mounted between a pair of electrodes has a specific mass spectrum, an element is excellent in a durability and that an organic compound layer having a specific mass spectrum is formed by strictly controlling deposition conditions when the organic compound layer is formed by a deposition method. The present invention has been completed on the basis of such findings.

That is, the present invention is an organic electroluminescence element, a process for producing the same, and further an organic electroluminescence film which follow.

1. An organic electroluminescence element in which an organic compound layer having at least an organic emitting layer is held between a pair of electrodes, an anode and a cathode, characterized in that the mass spectrum of at least one layer of the organic compound layer satisfies a relationship of formula (I)

$$\frac{\sum (I_{sn})}{I_M} \leq 25\% \tag{I}$$

(wherein $I_M$ represents an intensity of a main peak, and $I_{sn}$ represents an intensity of an n-th peak of sub-peaks).

2. The organic electroluminescence element as recited in the above 1, wherein the mass spectrum of at least one layer of the organic compound layer satisfies the relationship of formula (I) and a relationship of formula (II)

$$\Sigma|M_{MW}-S_{Mwn}| \leq 50 \tag{II}$$

(wherein $M_{MW}$ represents a mass of a main peak, and $S_{Mwn}$ represents a mass of an n-th peak of sub-peaks).

3. The organic electroluminescence element as recited in the above 1, wherein in at least one of the organic compounds used to form the organic compound layer, a ratio of a main peak area to a total peak area is at least 98% in the analysis by gel permeation chromatography (GPC).

4. A process for producing an organic electroluminescence element in which an organic compound layer having at least an organic emitting layer is held between a pair of electrodes, an anode and a cathode, characterized in that the organic compound layer is formed by deposition such that the mass spectrum of at least one layer of the organic compound layer satisfies a relationship of formula (I)

$$\frac{\sum (I_{sn})}{I_M} \leq 25\% \tag{I}$$

(wherein $I_M$ represents an intensity of a main peak, and $I_{sn}$ represents an intensity of an n-th peak of sub-peaks).

5. The process as recited in the above 4, wherein the organic compound layer is formed such that the mass spectrum of at least one layer of the organic compound layer satisfies the relationship of formula (I) and a relationship of formula (II)

$$\Sigma|M_{MW}-S_{Mwn}| \leq 50 \tag{II}$$

(wherein $M_{MW}$ represents a mass of a main peak, and $S_{Mwn}$ represents a mass of an n-th peak of sub-peaks).

6. The process as recited in the above 4, wherein in at least one of the organic compounds used to form the organic compound layer, a ratio of a main peak area to a total peak area is at least 98% in the analysis by gel permeation chromatography (GPC).

7. The organic electroluminescence element as recited in any of the above 1 to 3, characterized in that the organic compounds are compounds containing at least one of an anthracene structure, a naphthacene structure, a pyrene structure and a perylene structure in the skeleton structure.

8. The process as recited in any of the above 4 to 6, characterized in that the organic compounds are compounds containing at least one of an anthracene structure, a naphthacene structure, a pyrene structure and a perylene structure in the skeleton structure.

9. A process for producing an organic electroluminescence element in which an organic compound layer having at least an organic emitting layer is held between a pair of electrodes, an anode and a cathode, characterized in that the mass spectrum of a powder of an organic compound used to form the organic compound layer satisfies a relationship of formula (I)

$$\frac{\sum (I_{sn})}{I_M} \leq 25\% \tag{I}$$

(wherein $I_M$ represents an intensity of a main peak, and $I_{sn}$ represents an intensity of an n-th peak of sub-peaks), and a relationship of formula (II)

$$\Sigma|M_{MW}-S_{Mwn}| \leq 50 \tag{II}$$

(wherein $M_{MW}$ represents a mass of a main peak, and $S_{Mwn}$ represents a mass of an n-th peak of sub-peaks).

10. The process as recited in the above 4, wherein a degree of vacuum in the deposition is between $10^{-5}$ and $10^{-7}$ torr.

11. The process as recited in the above 4, wherein a distance between a substrate to be deposited and a deposition material in the deposition is between 5 and 60 cm.

12. The process as recited in the above 4, wherein a deposition rate is between 0.1 and 40 Å/sec.

13. An organic EL film in an organic EL element in which an organic compound film having at least an organic emitting layer is held between a pair of electrodes, an anode and a cathode, characterized in that the mass spectrum of at least one layer of the organic compound film satisfies a relationship of formula (I)

$$\frac{\sum (I_{sn})}{I_M} \leq 25\% \tag{I}$$

(wherein $I_M$ represents an intensity of a main peak, and $I_{sn}$ represents an intensity of an n-th peak of sub-peaks).

BEST MODE FOR CARRYING OUT THE INVENTION

The mode for carrying out the present invention is described below.

The organic EL element of the present invention is that the organic compound layer having at least the organic emitting layer is mounted between a pair of electrodes, an anode and a cathode. The organic compound layer may be a layer made of a emitting layer or a multi-layered structure obtained by laminating, with a emitting layer, a hole injecting and transporting layer, an electron injecting and transporting layer and the like. Examples of the element structure of the organic EL element can include (1) cathode/emitting layer/anode, (2) cathode/emitting layer/hole injecting and transporting layer/anode, (3) cathode/electron injecting and transporting layer/emitting layer/anode, (4) cathode/electron injecting and transporting layer/emitting layer/hole injecting and transporting layer/anode and the like.

In this organic EL element, the emitting layer has (1) an injection function by which in the application of an electric field, holes can be injected from an anode or a hole injecting and transporting layer and electrons can be injected from a cathode or an electron injecting and transporting layer, (2) a transport function by which charges (electrons and holes) injected are transported under the electric field, (3) a luminescence function by which a site of recombination of electrons and holes is provided in a emitting layer which leads to luminescence, and the like. The type of the emitting material used in this emitting layer is not particularly limited, and a material known so far as a emitting material in an organic EL element can be used. Further, the hole injecting and transporting layer is a layer made of a hole transport compound, having a function of transporting holes injected from an anode to a emitting layer. This hole injecting and transporting layer is interposed between an anode and a emitting layer, whereby many holes are injected in a emitting layer in a lower electric field. Besides, electrons injected in a emitting layer from a cathode or an electron injection layer improve a emitting efficiency of an EL element accumulated near the interface inside this emitting layer by the barrier of electrons present in the interface between the emitting layer and the hole injecting and transporting layer, providing an EL element having an excellent luminescence performance. The hole transport compound used in this hole injecting and transporting layer is not particularly limited, and a material known so far as a hole transport compound in an organic EL element can be used. Moreover, the electron injecting and transporting layer has a function of transporting electrons injected from a cathode to the emitting layer. The electron transport compound used in this electron injecting and transporting layer is not particularly limited, and a material known so far as an electron transport compound in an organic EL element can be used.

In addition, each organic compound layer can also contain a miner amount of an additive made of an organic compound or the like. The additive used here in the miner amount is called a dopant, and it is used for improving the electron injection property of each layer or improving the performance of the organic EL element such that it becomes itself a emitting center.

In the organic EL element of the present invention, at least one layer of the organic compound layer has to satisfy the relationship of formula (I) in the mass spectrum.

$$\frac{\sum (I_{sn})}{I_M} \leq 25\% \qquad (I)$$

$\left(\frac{\sum (I_{sn})}{I_M}\right.$ is hereinafter referred to as an IR value$\left.\right)$ (wherein $I_M$ represents an intensity of a main peak, and $I_{sn}$ represents an intensity of an n-th peak of sub-peaks) When this IR value exceeds 25%, an organic EL element having an excellent durability is not obtained, and the aim of the present invention is not achieved. In view of the durability, this IR value is preferably 20% or less, especially preferably 10% or less.

Further, in view of the durability of the element, the organic compound layer preferably satisfies the relationship of formula (II) in the mass spectrum, $$\Sigma |M_{MW} - S_{Mwn}| \leq 50 \qquad (II)$$

($\Sigma |M_{MW} - S_{Mwn}|$ is hereinafter referred to as a $\Delta M$ value) (wherein $M_{MW}$ represents a mass of a main peak, and $S_{Mwn}$ represents a mass of an n-th peak of sub-peaks). The $\Delta M$ value is more preferably 48 or less, especially preferably 32 or less.

Preferable examples of the organic compound used to form the organic compound layer constituting the organic EL element include compounds containing an anthracene skeleton, a naphthacene skeleton, a pyrene skeleton and a perylene skeleton. It is important that the amounts of the oxidized compound of these compounds are 25% or less as a relative value to the amount of the organic compound layer formed.

In recent years, anthracene derivatives, naphthacene derivatives, pyrene derivatives and perylene derivatives have widely been used as a hole transporting material, a hole injection material, a emitting material and a doping material because of a good balance of hole transport or a good balance of electron transport. Meanwhile, the anthracene skeleton, the naphthacene skeleton, the pyrene skeleton and the perylene skeleton per se are easily oxidized. Therefore, in the purification by sublimation or the production of the organic EL element, it was required to control a degree of vacuum, a sublimation temperature or a deposition temperature quite carefully. When a degree of vacuum is low or sublimation and deposition are conducted at high temperatures, oxidation easily occurs, oxidized compound of anthracene derivatives, naphthacene derivatives, pyrene derivatives and perylene derivatives (detected as +16 and +32 components in the mass spectrometry) are incorporated in a deposition layer. It is found that these oxidized components induce the decrease in properties of the EL element, for example, a emitting efficiency and red-shift of an emitting color and further notably reduce the EL life. These are considered to be ascribable to the decrease in fluorescence by the oxidized compounds and to the function of trapping holes or electrons. It was required to control the contents of the oxidized compound.

It is considered that the anthracene skeleton, the naphthacene skeleton, the pyrene skeleton and the perylene skeleton in the oxidized compound of these derivatives are present in the derivatives as divalent groups based on the following structures. However, these structures are not critical.

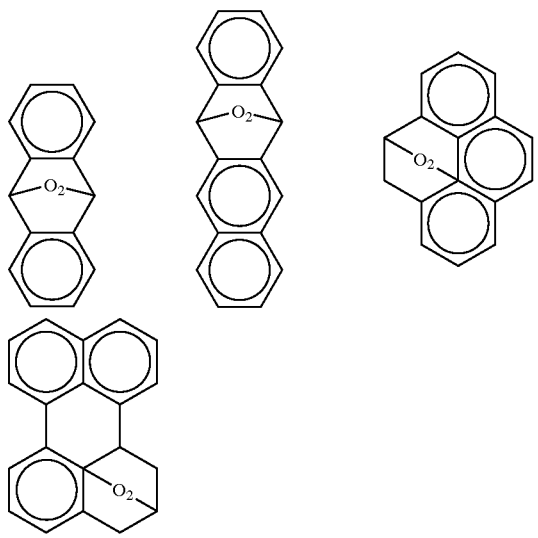

By the way, the above-described mass spectrum was measured in the following manner by FD-MS (field deposition mass spectrometry), and an intensity and a mass of each peak were found from the spectrum.

JMS-HX 110 supplied by JEOL, Ltd. was used as a device, and the measurement was conducted by coating a sample prepared from an organic EL element or an organic EL film on an emitter.

Further, in the organic EL element of the present invention, for forming the organic compound layer having the above-described properties, a ratio of a main peak area to a total peak area in the organic compound used to form the organic compound layer is preferably at least 98%, more preferably at least 99%, especially preferably at least 99.5% in the analysis by gel permeation chromatography (GPC). This results in effectively forming the organic compound layer having the above-described properties.

Incidentally, the analysis by GPC is conducted by the following method.

HM+G3000H8+G2000H8+G1000H8 was used as a column (supplied by Tosoh Corp.), and tetrahydrofuran (hereinafter abbreviated as THF) was used as a solvent. The sample was dissolved in THF, and eluted at a flow rate of 1.4 ml/min. The detection was conducted using UV (ultraviolet rays) or RI (refractive index).

A method of obtaining such a high-purity organic compound is not particularly limited. A method known so far, for example, a method of purification by sublimation, a recrystallization method, a re-precipitation method, a zone melting method, a column purification method, an adsorption method or the like can be used. It is advantageous to employ a recrystallization method and a method of purification by sublimation in case of an organic compound having a sublimation property.

The recrystallization method is not particularly limited, and a method known so far can be used. Further, as an organic compound having a sublimation property, a compound capable of sublimation is available, and it is not particularly limited. Examples thereof can include a chelate complex compound, a quinacridone compound, a phthalocyanine compound, a compound having an aromatic condensed ring and other various compounds. As a method of purification by sublimation, for example, a stirring method or a vibration method can be employed.

The organic EL element in which at least one layer of the organic compound layer has the above-described properties can be produced, according to the process of the present invention, upon forming the organic compound layer by a physical vapor-phase deposition method (PVD method) such as vacuum deposition, sputtering or the like.

With respect to the compound containing the anthracene structure, the naphthacene structure, the pyrene structure or the perylene structure used in the present invention, it is preferable that an oxide peak [M (1)+16 or +32] is not detected even in the mass spectrometry in the state of a raw powder before deposition. Even when an oxidized compound is incorporated in a powdery state and an element is produced by vacuum deposition, it is preferable that the oxide component of the EL element or the deposition film on which the compound is deposited satisfies the above-described conditions.

Further, a condition of a boat temperature in the purification by sublimation or the deposition varies with a shape of a boat or a vacuum atmosphere. It is possible that a compound containing an anthracene structure, a naphthacene structure, a pyrene structure or a perylene structure is subjected to TG-DTA measurement and heating is conducted in a condition of up to a temperature for weight reduction of up to 5%. Especially preferable is compound melting point±30° C.

With respect to an analytical method the deposition film (organic EL film), it is possible that the EL element is dissolved in an organic solvent (THF, toluene or the like), the solution is analyzed by mass spectrometry (FD-MS or the like), and judgement is conducted from the spectrum. Further, the judgement can easily be conducted by depositing a predetermined amount (for example, more than 1,000 Å) of a compound containing an anthracene structure, a naphthacene structure, a pyrene structure or a perylene structure on a glass substrate, dissolving the same in an organic solvent and likewise subjecting the solution to the mass spectrometry.

Specific examples of the compound containing the anthracene structure, the naphthacene structure, the pyrene structure or the perylene structure used in the present invention are mentioned below. However, these structures are not critical.

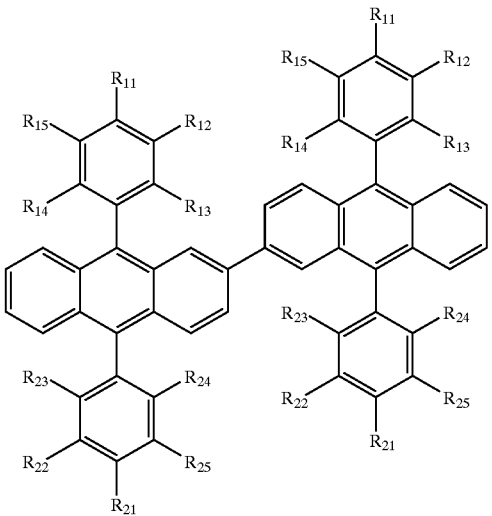

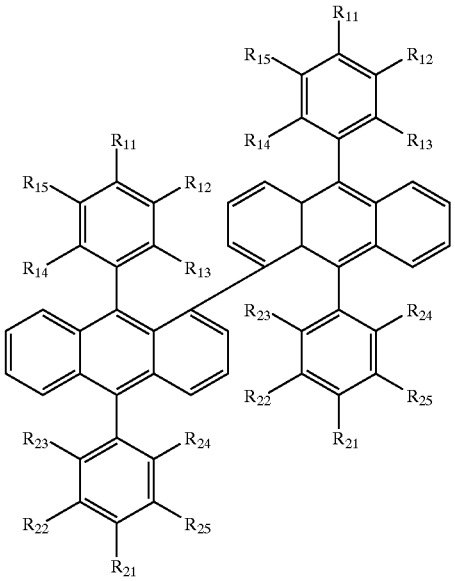

-continued
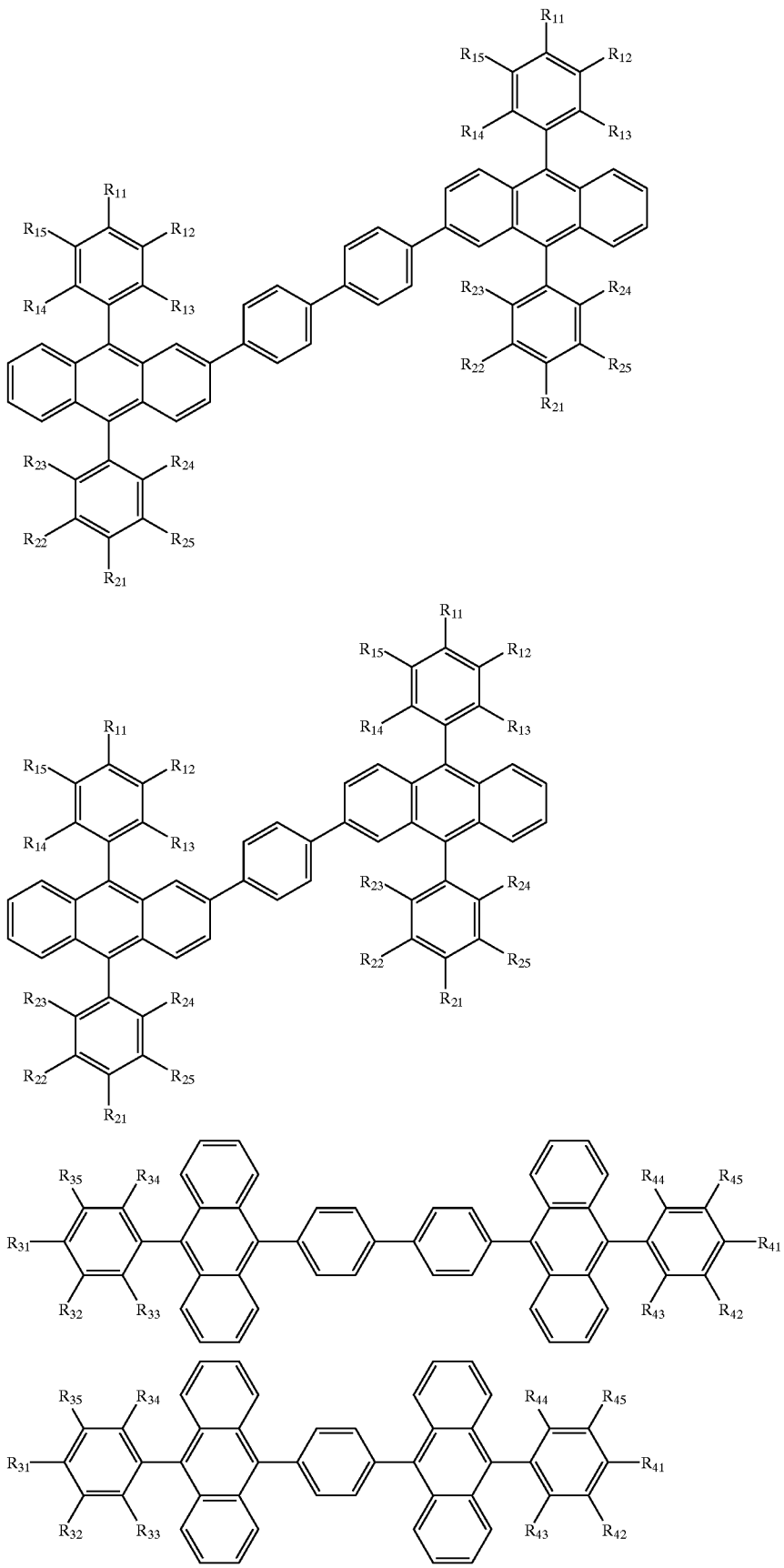

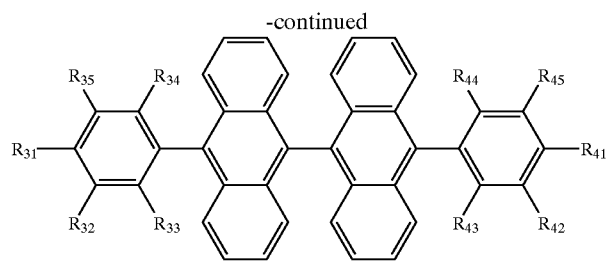
(wherein $R_{11}$–$R_{45}$ each represent an alkyl group, a cycloalkyl group, an aryl group, an alkenyl group, an alkoxy group, an aryloxy group, an amino group or a heterocyclic group, and they may be the same or different.)
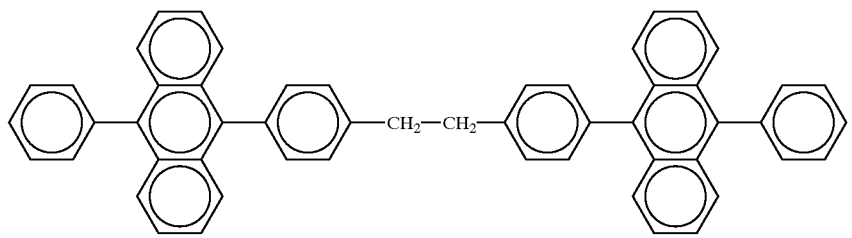
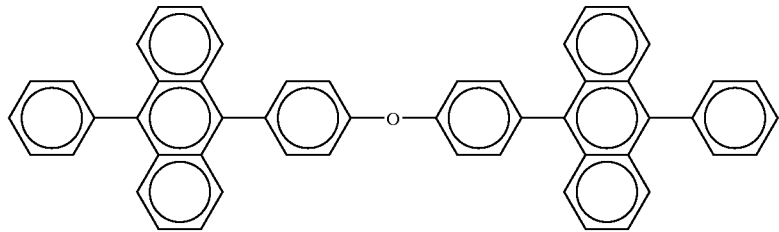
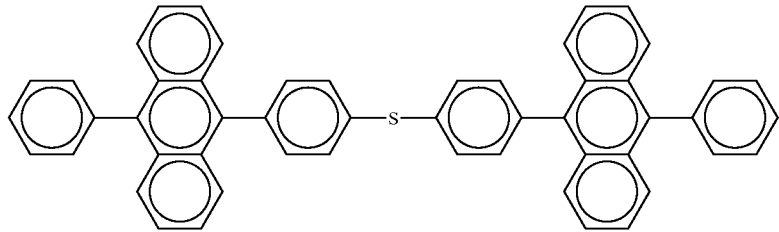
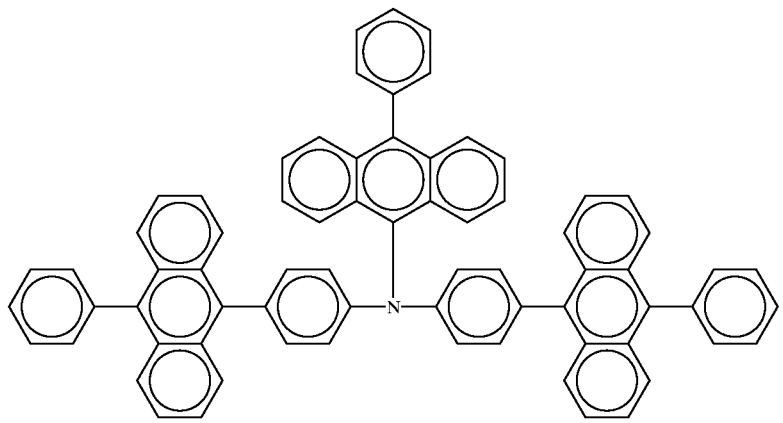

-continued
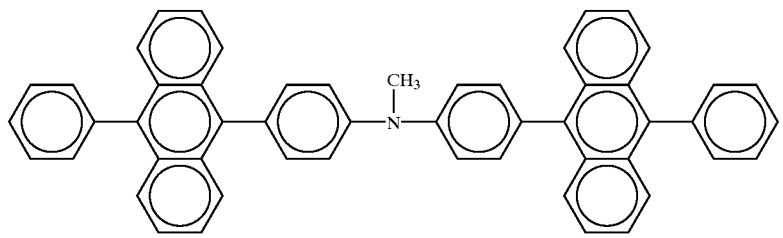
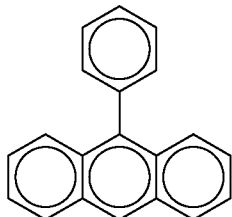
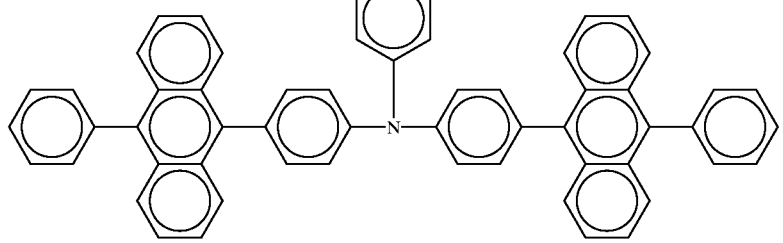
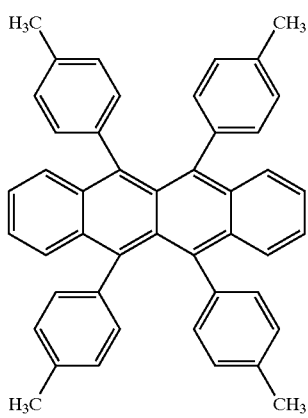 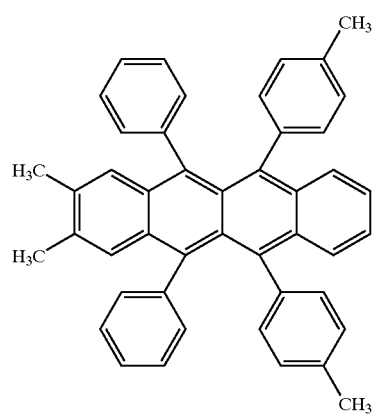 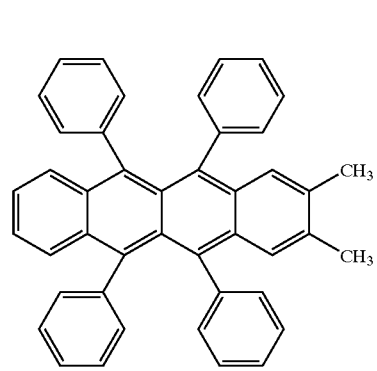
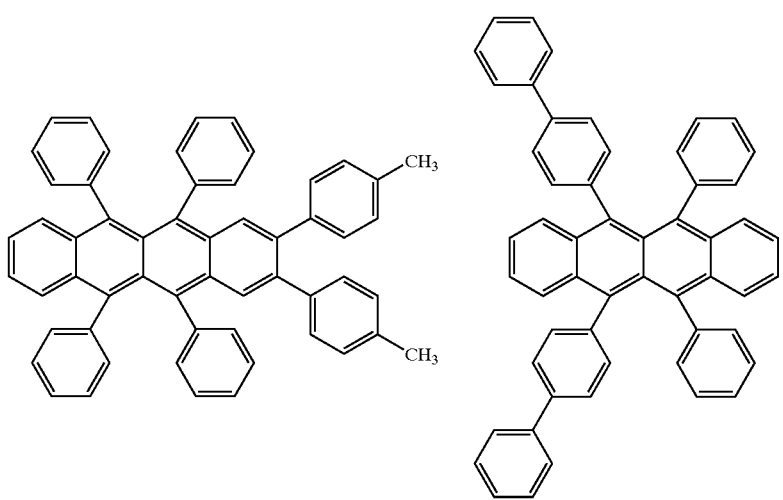 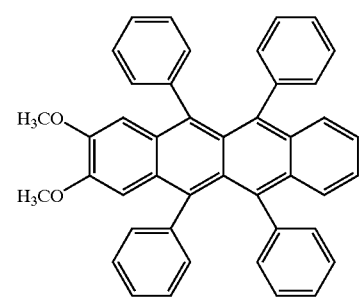

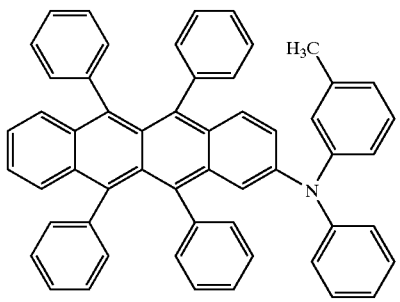 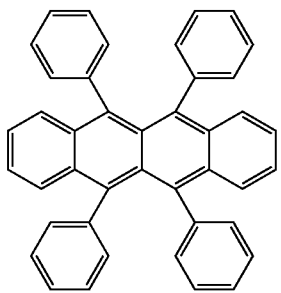 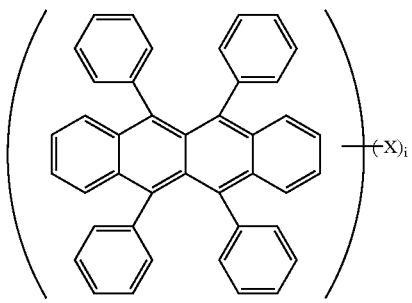

(wherein X represents a halogen atom, a cyano group, a substituted or unsubstituted alkyl group, a substituted or unsubstituted aryl group, a substituted or unsubstituted alkoxy group, a substituted or unsubstituted aryloxy group, a substituted or unsubstituted alkylthio group, a substituted or unsubstituted arylthio group, a substituted or unsubstituted cycloalkyl group, a substituted or unsubstituted heterocyclic group, a substituted or unsubstituted amino group or a rubrene derivative, i represents an integer of 1 to 28, and X's may be the same or different.)

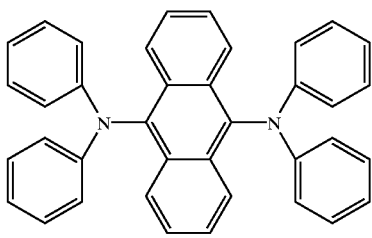

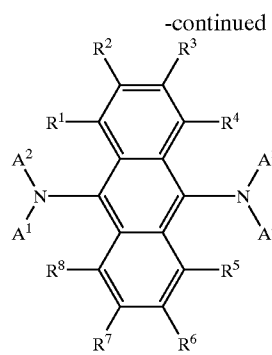

(wherein $A^1$ to $A^4$, independently from each other, represent an aryl group having 6 to 16 carbon atoms, and $R^1$ to $R^8$, independently from each other, represent a hydrogen atom, a halogen atom, an alkyl group, an alkoxy group, an aryl group or an amino group.)

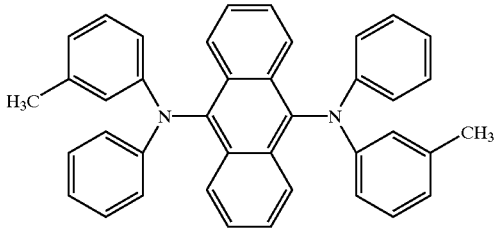

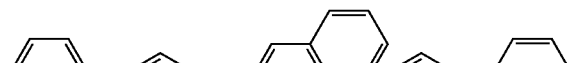

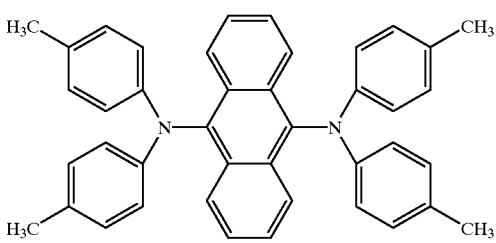

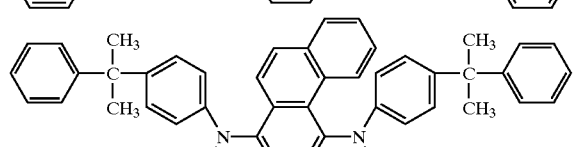

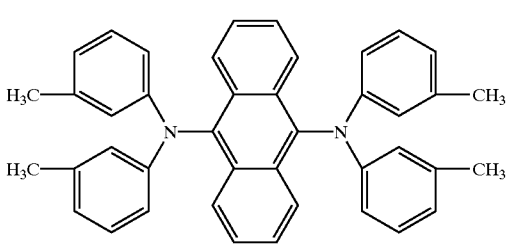

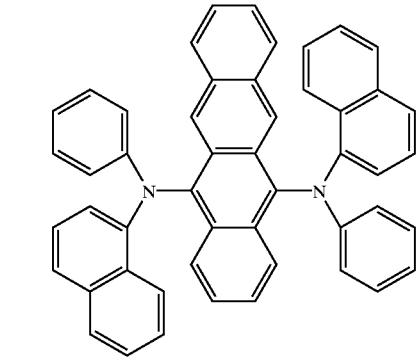

-continued

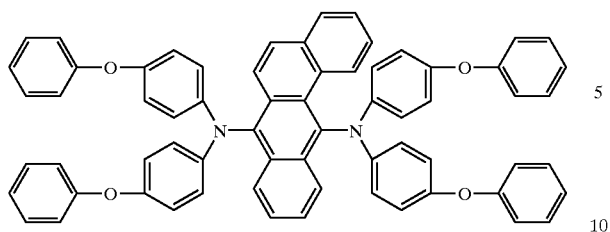

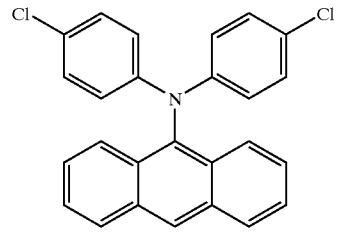

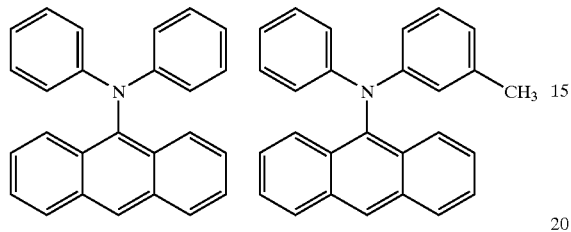

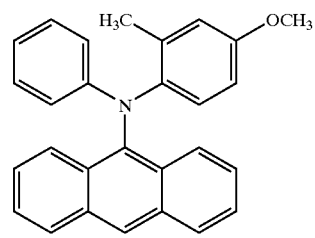

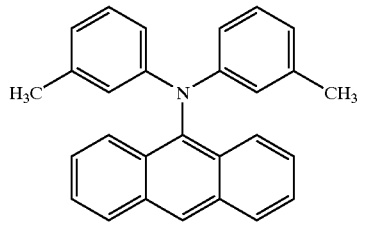

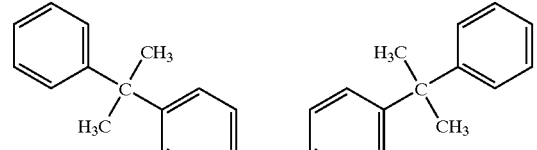

(wherein A and B each represent an aromatic ring which may have a substituent.)

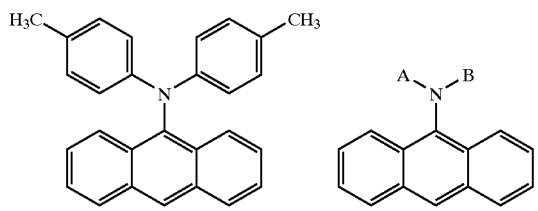

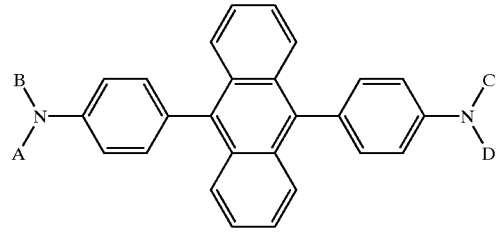

(wherein A, B, C and D each represent a substituted or unsubstituted alkyl group, a substituted or unsubstituted monocyclic group, or a substituted or unsubstituted condensed polycyclic group, and A and B or C and D together form a heterocyclic group through a nitrogen atom as a bonding site.)

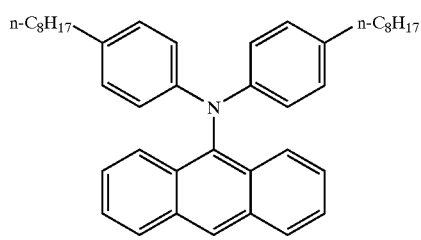

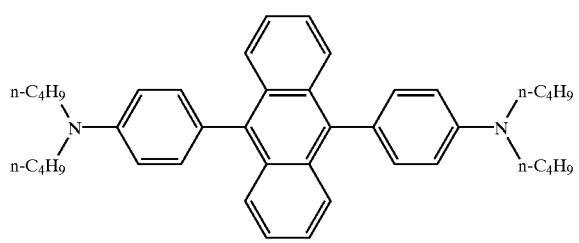

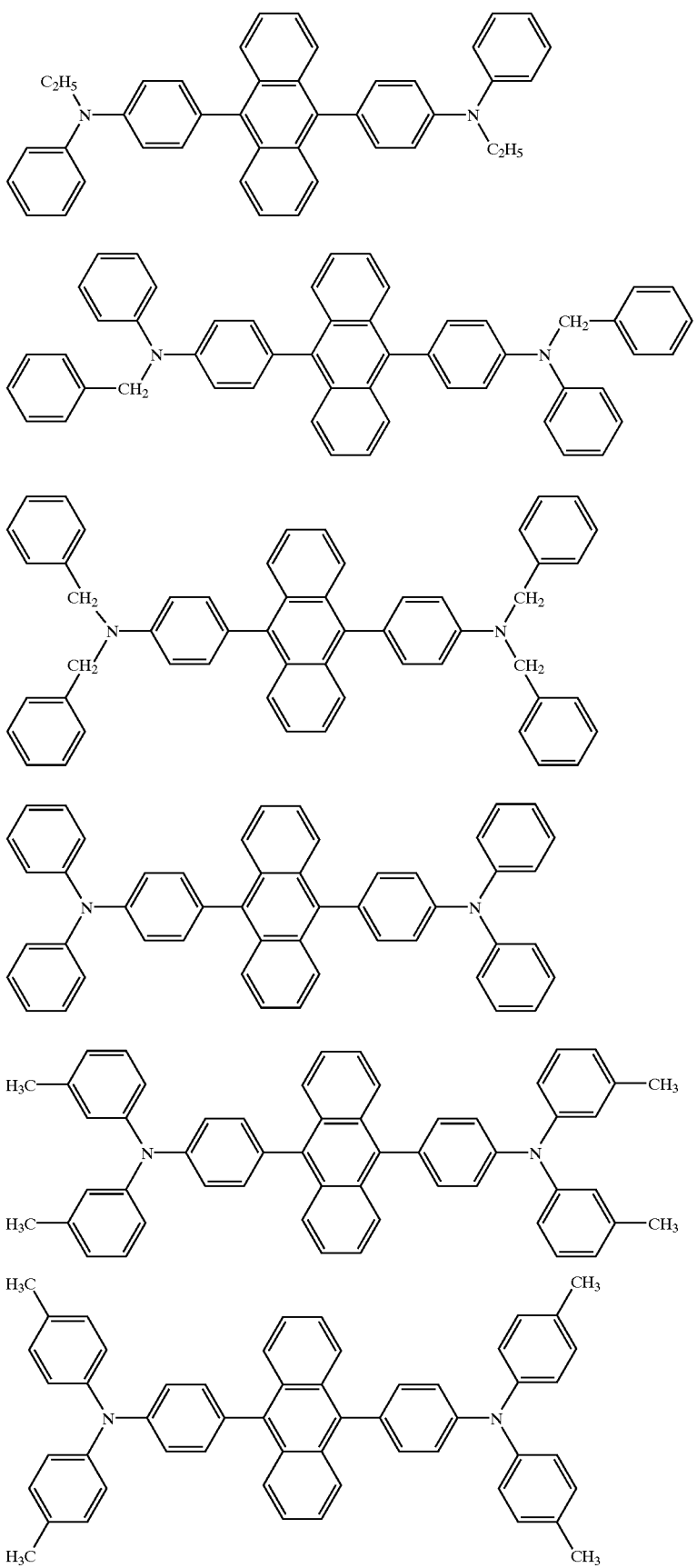

-continued

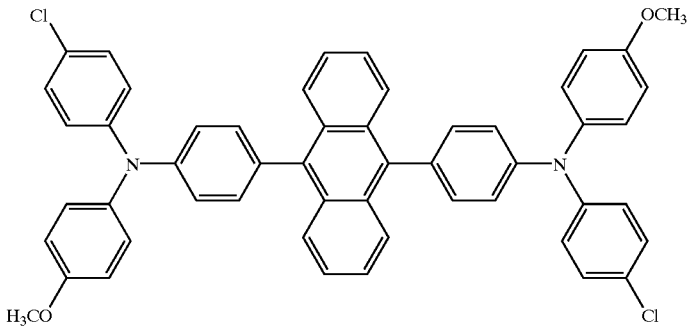

It is important to strictly control the deposition conditions in forming the organic compound layer. That is, it is advisable that the degree of vacuum in the deposition is in the range of a pressure of $10^{-5}$ to $10^{-7}$ torr. When this pressure exceeds $10^{-5}$ torr, an organic compound combined with an impurity gas is present in the organic compound layer formed by the presence of the impurity gas, making it difficult to form the organic compound layer having the above-described properties and to obtain the organic EL element having the desired durability. On the other hand, when the pressure is less than $10^{-7}$ torr, the cost of the apparatus is increased which is economically disadvantageous. In consideration of the durability of the element and the economics, it is especially preferable that the degree of vacuum in the deposition is a pressure in the order of $10^{-6}$ torr.

It is further preferable that a distance between a substrate to be deposited and a deposition material in the deposition is in the range of 5 to 60 cm. When the distance deviates from this range, there is a tendency that the organic compound layer having the above-described properties is hardly formed. For forming the organic compound layer having the desired properties, the more preferable range of the distance is between 20 and 40 cm.

Further, it is preferable that the deposition rate is in the range of 0.1 and 40 Å/sec. When this deposition rate deviates from the above-described range, there is a tendency that the organic compound layer having the above-described properties is hardly formed. For forming the organic compound layer having the desired properties, the more preferable range of the deposition rate is between 0.1 and 20 Å/sec.

In the organic EL element of the present invention, it is advisable that each organic compound layer and the organic EL film are formed by a physical vapor-phase deposition method(PVD method) such as vacuum deposition, sputtering or the like using the organic compounds comprising them.

It is advisable that the organic EL element of the present invention is supported on a substrate. The substrate here is not particularly limited, and a substrate which has been so far employed in an organic EL element, for example, a substrate made of a glass or transparent plastics is used.

The anode in this organic EL element is an electrode for injecting holes in the element. In this anode, a metal, an alloy, an electroconductive compound or a mixture thereof having a large work function (4 eV or more) is preferably used as an electrode material. Specific examples of this electrode material include metals such as Au and the like, and electroconductive transparent materials such as CuI, ITO (indium tin oxide), $SnO_2$, ZnO, InZnO (indium zinc oxide) and the like. This anode can be produced by forming these electrode materials into a thin film by a method such as vacuum deposition, sputtering or the like. When luminescence is obtained from this electrode, it is advisable that a transmission of light emitted is higher than 10%, and it is further advisable that a sheet resistance as an electrode is less than several hundreds of 12Ω/square.

Moreover, the film thickness is usually selected from the range of 10 nm to 1 μm, preferably from the range of 50 to 200 nm, though it depends on the material.

Meanwhile, the cathode is an electrode for injecting electrons in the element. As this cathode, a metal, an alloy, an electroconductive compound or a mixture thereof having a small work function (4 eV or less) is used as an electrode material. Specific examples of this electrode material include sodium, a sodium-potassium alloy, magnesium, lithium, a magnesium/copper mixture, a magnesium/silver alloy, an aluminum-lithium alloy, an $Al/Al_2O_3$ mixture, indium, rare earth metals and the like. This cathode can be produced by, for example, forming these electrode materials into a thin film by a method such as vacuum deposition, sputtering or the like. When luminescence is obtained from this electrode, it is advisable that a transmission of light emitted is higher than 10%, and it is further advisable that a sheet resistance as an electrode is less than several hundreds of 12Ω/square. Moreover, the film thickness is usually selected from the range of 10 nm to 1 μm, preferably from the range of 50 to 200 nm, though it depends on the material.

The compounds used in the present invention, such as the anthracene derivatives, the naphthacene derivatives, the pyrene derivatives and perylene derivatives are effective as a material in the EL element. A emitting layer can be produced from these compounds by forming the compounds into a thin film by a known method such as a deposition method, a spin-coating method, a casting method or the like. It is especially preferable to form a molecular accumulated film. The molecular accumulated film here refers to a thin film formed by precipitating the compound from a gaseous-phase state or a film formed by solidifying the compound from a solution state or a liquid state. For example, a deposition film or the like is mentioned. Usually, this molecular accumulated film can be distinguished from a thin film (molecular built-up film) formed by the LB method. Further, the emitting layer can be formed, as disclosed in Japanese Patent Laid-Open No. 194393/1984, by dissolving a binder such as a resin or the like and the compound in a solvent, and then forming the solution into a thin film by a spin-coating method or the like.

The film thickness of the thus-formed emitting layer is not particularly limited, and can be selected as occasion demands. It is usually selected from the range of 5 nm to 5 μm.

In each of the above-described compounds used in this emitting layer, the ionization energy is generally less than approximately 6.0 eV. Accordingly, when an appropriate anode metal or anode compound is selected, it is relatively easy to inject holes. Further, the electron affinity is higher than approximately 2.8 eV. Accordingly, when an appropriate cathode metal or cathode compound is selected, it is relatively easy to inject electrons, and an ability to transport electrons and holes is also excellent. Moreover, owing to a strong fluorescence in a solid state, an ability to convert an excited state provided in recombining of electrons and holes in the compound, its association substance or crystal and the like into light is great.

The construction of the organic EL element in the present invention, as stated above, involves various modes. The hole injecting and transporting layer in the EL element having the construction (2) or (3) is a layer made of a hole transport compound, and it has a function of transporting holes injected from an anode to a emitting layer. This hole injecting and transporting layer is interposed between the anode and the emitting layer to inject a large number of holes in the emitting layer in a lower electric field. Moreover, electrons injected in the emitting layer from the cathode or the electron injection layer improve the emitting efficiency of the EL element accumulated near the interface in this emitting layer by the energy barrier of electrons present in the interface between the emitting layer and the hole injecting and transporting layer to provide the EL element having the excellent luminescence performance.

The hole transport compound used in the hole injecting and transporting layer is such a compound that when the layer is disposed between two electrodes to which an electric field is applied and holes are injected from the anode, the holes can appropriately be transportred to the emitting layer. For example, a compound having hole mobility of at least $10^{-6}$ cm$^2$/(V.sec) under the electric field of $10^4$ to $10^6$ V/cm is preferable. Such a hole transport compound is not particularly limited so long as it has the above-described desirable properties. Any compounds ordinarily used as a hole charge transport material in an electroconductive material and any known compounds used in a hole injecting and transporting layer of an EL element can selectively be used.

Examples of the charge transport material can include triazole derivatives (described in U.S. Pat. No. 3,112,197, and so forth), oxadiazole derivatives (described in U.S. Pat. No. 3,189,447, and so forth), imidazole derivatives (described in Japanese Patent Publication No. 16096/1962, and so forth), polyarylalkane derivatives (described in U.S. Pat. Nos. 3,615,402, 3,820,989 and 3,542,544, Japanese Patent Publication Nos. 555/1970 and 10983/1976, Japanese Patent Laid-Open Nos. 93224/1976, 17105/1980, 4148/1981, 108667/1980, 156953/1980 and 36656/1981, and so forth), pyrazoline derivatives and pyrazolone derivatives (described in U.S. Pat. Nos. 3,180,729 and 4,278,746, Japanese Patent Laid-Open Nos. 88064/1980, 88065/1980, 105537/1974, 51086/1980, 80051/1981, 88141/1981, 45545/1982, 112637/1979 and 74546/1980, and so forth), phenylenediamine derivatives (described in U.S. Pat. No. 3,615,404, Japanese Patent Publication Nos. 10105/1976, 3712/1971 and 25336/1972, Japanese Patent Laid-Open Nos. 53435/1979, 110536/1979 and 119925/1979, and so forth), arylamine derivatives (described in U.S. Pat. Nos. 3,567,450, 3,180,703, 3,240,597, 3,658,520, 4,232,103, 4,175,961 and 4,012,376, Japanese Patent Publication Nos. 35702/1974 and 27577/1964, Japanese Patent Laid-Open No. 144250/1980, 119132/1981 and 22437/1981, West German Patent No. 1,110,518, and so forth), amino-substituted chalcone derivatives (described in U.S. Pat. No. 3,526,501, and so forth), oxazole derivatives (described in U.S. Pat. No. 3,257,203, and so forth), styrylanthracene derivatives (described in Japanese Patent Laid-Open No. 46234/1981, and so forth), fluorenone derivatives (described in Japanese Patent Laid-Open No. 110837/1979, and so forth), hydrazone derivatives (described in U.S. Pat. No. 3,717,462, and Japanese Patent Laid-Open Nos. 59143/1979, 52063/1980, 52064/1980, 46760/1980, 85495/1980, 11350/1982 and 148749/1982, and so forth), stilbel derivatives (described in Japanese Patent Laid-Open Nos. 210363/1986, 228451/1986, 14642/1986, 72255/1986, 47646/1987, 36674/1987, 10652/1987, 30255/1987, 93445/1985, 94462/1985, 174749/1985 and 175052/1985, and so forth) and the like.

These compounds can be used as the hole transport compound. Porphyrin compounds (described in Japanese Patent Laid-Open No. 295695/1988, and so forth), aromatic tertiary amine compounds and styrylamine compounds (described in U.S. Pat. No. 4,127,412, Japanese Patent Laid-Open Nos. 27033/1978, 58445/1979, 149634/1979, 64299/1979, 79450/1980, 144250/1980, 119132/1981, 295558/1986, 98353/1986 and 295695/1988, and so forth) mentioned below are used preferably, and the aromatic tertiary amine compounds are used especially preferably.

Typical examples of the porphyrin compounds include porphyrin; 5,10,15,20-tetraphenyl-21H,23H-porphyrin copper (II); 5,10,15,20-tetraphenyl-21H,23H-porphyrin zinc (II); 5,10,15,20-tetrakis (pentafluorophenyl) -21H ,23H-porphyrin; silicon phthalocyanine oxide; aluminum phthalocyanine chloride: phthalocyanine (nonmetal); dilithium phthalocyanine; copper tetramethyl phthalocyanine; copper phthalocyanine; chromium phthalocyanine; zinc phthalocyanine; lead phthalocyanine; titanium phthalocyanine oxide; magnesium phthalocyanine; copper octamethyl phthalocyanine; and the like. Further, typical examples of the aromatic tertiary compounds and the styrylamine compounds include N,N,N', N'-tetraphenyl-(1,1'-biphenyl)-4,4'-diamine; N,N'-bis(3-methylphenyl)-N,N'-diphenyl-[1,1'-biphenyl]-4,4'-diamine; 2,2-bis(4-di-p-tolylaminophenyl) propane; 1,1-bis(4-di-p-tolylaminophenyl)cyclohexane; N,N,N',N'-tetra-p-tolyl-(1,1'-biphenyl)-4,4'-diamine; 1,1-bis (4-di-p-tolylaminophenyl)-4-phenylcyclohexane; bis(4-dimethylamino-2-methylphenyl)phenylmethane; bis(4-di-p-tolylaminophenyl)phenylmethane; N,N'-diphenyl-N,N'-di (4-methoxyphenyl)-1,1'-biphenyl)-4,4'-diamine; N,N,N',N'-tetraphenyl-4,4'-diaminodiphenyl ether; 4,4'-bis (diphenylamino)quadriphenyl; N,N,N-tri(p-tolyl)amine; 4-(di-p-tolylamine)-4'-[4-(di-p-tolylamine)styryl]stilbene; 4-N,N-diphenylamino-(2-diphenylvinyl)benzene; 3-methoxy-4'-N,N-diphenylaminostilbene; N-phenylcarbazole; and the like.

The hole injecting and transporting layer in the EL element may be formed of one layer made of one or more types of these hole transport compounds or may be one obtained by laminating a hole injecting and transporting layer made of a compound different from that of the above-described layer.

Meanwhile, the electron injection layer (electron injecting and transporting layer) in the EL element having the above-described construction (3) is made of an electron transport compound, and it has a function of transporting electrons injected from a cathode to a emitting layer. Such an electron transport compound is not particularly limited, and any compounds known so far can selectively be used. Preferable examples of the electron transport compound include nitro-substituted fluorenone derivatives such as

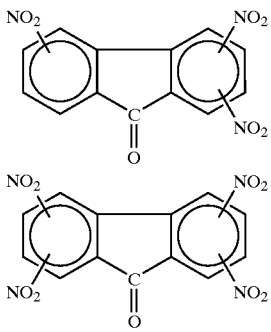

thiopyran dioxide derivatives such as

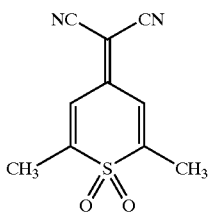

diphenylquinone derivatives [described in *Polymer Preprints, Japan*, vol. 37, No. 3, p. 681 (1988), and so forth] such as

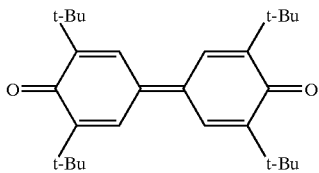

compounds [described in *Journal of Applied Physics (J. Apply. Phys.)*, vol. 27, p. 269 (1988)] such as

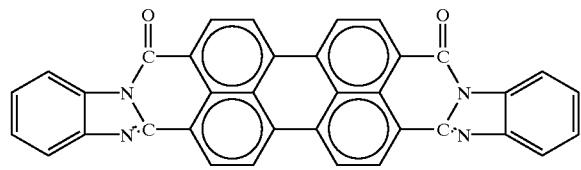

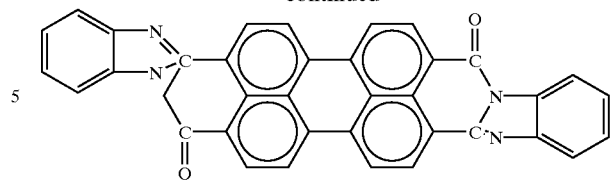

anthraquinodimnethane derivatives (described in Japanese Patent Laid-Open Nos. 149259/1982, 55450/1983, 225151/1986, 233750/1986 and 104061/1988, and so forth), fluorenylidenemethane derivatives (described in Japanese Patent Laid-Open Nos. 69657/1985, 143764/1986 and 148159/1986, and so forth), anthrone derivatives (described in Japanese Patent Laid-Open Nos. 225151/1986 and 233750/1986, and so forth), and electron transport compounds represented by the following general formula (A) or (B)

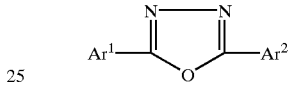
(A)

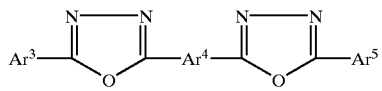
(B)

(wherein $Ar^1$ to $Ar^3$ and $Ar^5$, independently from each other, represent a substituted or unsubstituted aryl group, and $Ar^4$ represents a substituted or unsubstituted arylene group).

Examples of the aryl group here include a phenyl group, a naphthyl group, a biphenyl group, an anthranyl group, a perylenyl group, a pyrenyl group and the like. Examples of the arylene group include a phenylene group, a naphthylene group, a biphenylene group, an anthracenylene group, a peryl enylene group, a pyrenylene group and the like. Further, examples of the substituent include an alkyl group having 1 to 10 carbon atoms, an alkoxy group having 1 to 10 carbon atoms, a cyano group and the like. The compounds represented by this general formula (A) or (B) are preferably compounds having a thin film-forming property.

Specific examples of the compounds represented by the general formula (A) or (B) include

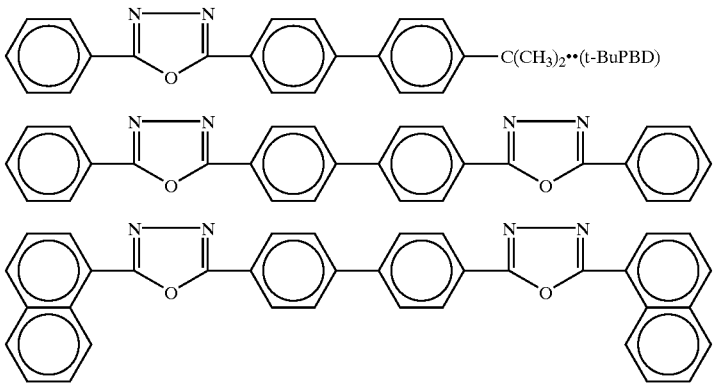

-continued

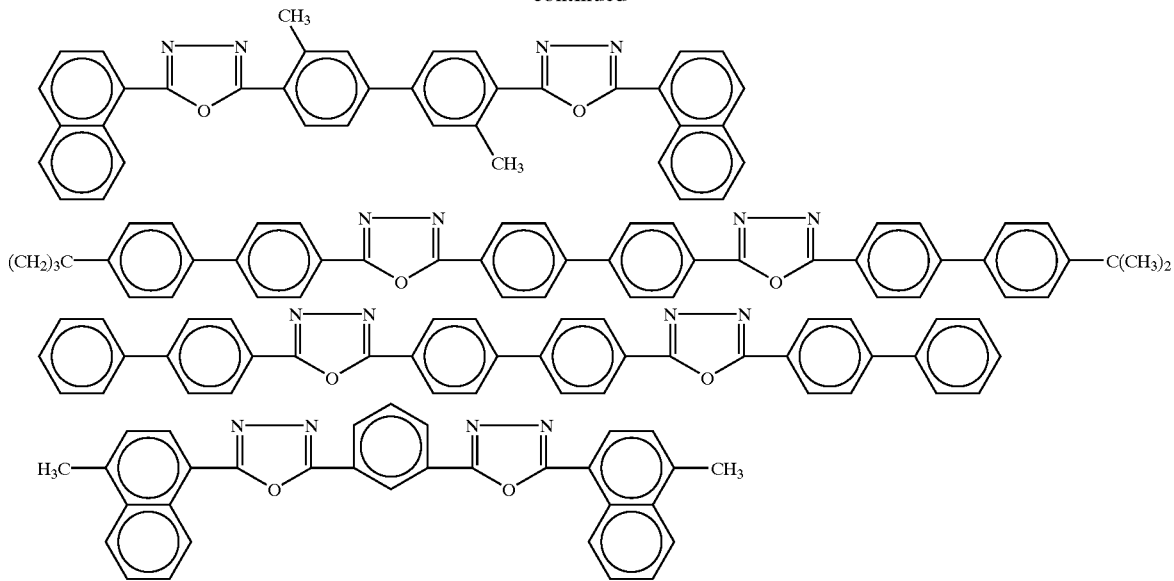

and the like.

Incidentally, the hole injecting and transporting layer and the electron injection layer are layers having any of a charge injection property, a charge transport property and a charge barrier property. Besides the above-described organic materials, inorganic materials such as Si-type, SiC-type and CdS-type crystalline or amorphous materials are also available.

The hole injecting and transporting layer and the electron injection layer using the organic materials can be formed like the emitting layer. The hole injecting and transporting layer and the electron injection layer using the inorganic materials can be formed by a vacuum deposition method or sputtering. In case of using the organic and inorganic materials, it is advisable to form the layers by a vacuum deposition method for the same reasons as in the formation of the emitting layer.

Next, an example of an appropriate process for producing the EL element of the present invention is described with respect to each of the elements having various constructions. A process for producing an EL element formed of the above-mentioned anode/emitting layer/cathode is described. First, a thin film made of a desired electrode material, for example, an anode material is formed on an appropriate substrate to a film thickness in the range of 1 µm or less, preferably 10 to 20 nm by a method such as deposition, sputtering or the like to prepare an anode. Then, a thin film of at least one compound selected from anthracene derivatives, naphthacene derivatives, pyrene derivatives and perylene derivatives as a emitting material is formed thereon to provide a emitting layer. A method of forming the thin film of the emitting material includes, for example, a spin-coating method, a casting method, a deposition method and the like. The deposition method is preferable because a uniform film is easily obtained and pinholing less occurs.

When the deposition method is employed to form the thin film of the emitting material, it is important to strictly control the deposition conditions as stated above. It is advisable to set the film thickness at 5 nm to 5 µm. Subsequently, after the formation of the emitting layer, a thin film made of a cathode material is formed thereon to a film thickness of 1 µm or less, preferably 50 to 200 nm by a method such as deposition, sputtering or the like to provide a cathode, whereby a desired EL element is obtained. Incidentally, in the production of this EL element, it is also possible to produce the cathode, the emitting layer and the anode in this order upon inverting the production order.

Further, in a process for producing an element comprising anode/emitting layer/cathode in which a hole injecting and transporting material, a emitting material and an electron injection material in the form of a mixture are held between a pair of electrodes to provide a emitting layer, for example, a thin film made of an anode material is formed on an appropriate substrate, and a solution comprising a hole injecting and transporting material, a emitting material, an electron injection material, a binder such as polyvinyl carbazole, and the like is coated thereon, or a thin film is formed from this solution by a dip-coating method to provide a emitting layer, and a thin film made of a cathode material is formed thereon. In this case, it is also possible that an element material which becomes a material of a emitting layer is further vacuum-deposited on the emitting layer formed and a thin film made of a cathode material is formed thereon. Alternatively, it is also possible that a hole injecting and transporting material, an electron injection material and a emitting material are deposited simultaneously to form a emitting layer and a thin film made of a cathode material is formed thereon.

The production of an EL element comprising anode/hole injecting and transporting layer/emitting layer/cathode is described below. First, an anode is formed as in the above-described EL element, and a thin film made of a hole transport compound is formed thereon by a spin-coating method to provide a hole injecting and transporting layer. In this case, the conditions can be set according to the conditions of forming the thin film of the emitting material. Then, a emitting layer and a cathode are formed in this order on this hole injecting and transporting layer as in the production of the above-described EL element to obtain a desired EL element. In the production of this EL element also, it is possible to produce the cathode, the emitting layer, the hole injecting and transporting layer and the anode in this order upon inverting the production order.

Further, a process for producing an EL element comprising anode/hole injecting and transporting layer/emitting layer/electron injection layer/cathode is described. First, as in the production of the above-described EL element, an anode, a hole injecting and transporting layer and a emitting layer are formed in this order. Then, a thin film made of an electron transport compound is formed on this emitting layer by a spin-coating method to form an electron injection layer. Subsequently, a cathode is formed thereon as in the production of the above-described EL element to obtain a desired EL element.

Incidentally, in the production of this EL element also, it is possible to produce the anode, the electron injection layer, the emitting layer, the hole injecting and transporting layer and the anode in this order upon inverting the order of the production.

When a DC voltage is applied to the thus-obtained organic EL element of the present invention, an anode is rendered positive and a cathode negative respectively, and a voltage of approximately 3 to 40 V is applied. Then, luminescence can be observed in a transparent or semi-transparent electrode side. Further, when a voltage is applied in the inverse polarity, a current is not passed, and luminescence does not occur at all. Still further, in case of applying an AC voltage, luminescence occurs only when a positive pole is rendered positive and a negative pole negative respectively. By the way, the waveform of the AC voltage applied may be optional.

The present invention is illustrated more specifically with reference to the following Examples. However, the present invention is not limited to these Examples.

PRODUCTION EXAMPLE 1

Production of a Emitting Material:

As a emitting material, 4,4"-bis(2,2-diphenylvinyl-1-yl)-p-terphenylene (hereinafter abbreviated as DPVTP) having the following structure was produced.

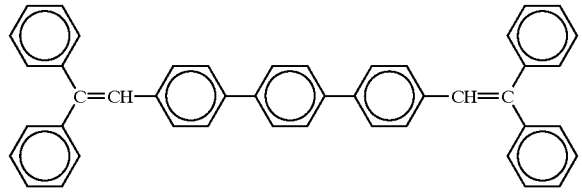

In a 100-milliliter three-necked flask, 1.0 g of benzophenone and 1.2 g of phosphonic acid ester having a structure represented by the following formula

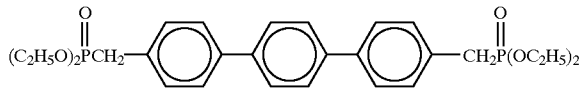

were suspended in 30 milliliters of dimethyl sulfoxide dried with a molecular sieve in an atmosphere of an argon gas.

This suspension was reacted with the addition of 0.5 g of potassium t-butoxide at room temperature. Then, the reaction product immediately became a reddish brown suspension. Subsequently, the reaction temperature was maintained at 27° C., and stirring was conducted for approximately 1 hour. Then, this reaction product became a yellow suspension. The stirring was further conducted for 2 hours, and a yellow precipitate was then collected by filtration with the addition of 40 milliliters of methanol.

Subsequently, this yellow precipitate was suspended in 100 milliliters of toluene, and a desired product was heat-extracted. Toluene was then distilled off to obtain 0.5 g of a white powder. This was designated DPVTP-1.

This powder was purified by sublimation under conditions of a boat temperature of 320° C. and $10^{-5}$ torr to obtain 0.38 g of a purified powder. This was designated DPVTP-2.

PRODUCTION EXAMPLE 2

Production of a Hole Injection Material:

As a hole injection material, 4,4',4"-tris-[N-(m-tolyl) - N-phenylamino] triphenylamine (hereinafter abbreviated as MTDATA) having the following structure was produced.

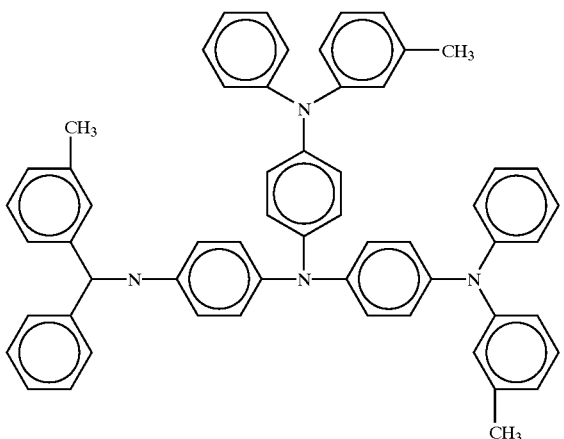

A 300-milliliter three-necked flask was charged with 1.0 g of 4,4',4"-triiodotriphenylamine, 1.0 g of N-(3-tolyl)-N-phenylamine (supplied by Aldrich), 3 g of anhydrous potassium carbonate and 1.0 g of a copper powder, and the mixture was dissolved in 200 milliliters of dimethyl sulfoxide. The reaction was conducted by stirring at 200° C. for 8 hours.

After the completion of the reaction, the reaction solution was filtered, and the mother liquor was extracted with methylene chloride. And, the solvent was distilled off with a rotary evaporator, and the residue was purified by chromatography on a column filled with silica gel (supplied by Hiroshima Wako Junyaku) using toluene as an elution solvent to obtain 0.3 g of a pale yellow powder. This was designated MTDATA-1.

This was further purified by sublimation three times under conditions of a boat temperature of 390° C. and $10^{-5}$ torr to obtain 0.24 g of a pale yellow powder. This was designated MTDATA-2.

PRODUCTION EXAMPLE 3

Production of a Hole Transport Material:

As a hole transport material, N,N'-di-(naphthyl-1-yl)-N, N'-diphenyl-4,4"-benzidine (hereinafter abbreviated as NPD) having the following structure was produced.

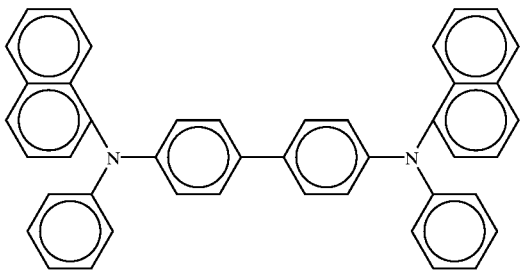

The reaction and the purification were conducted in the same manner as in Production Example 2 except that 2.0 g of 1-iodonaphthalene (supplied by Tokyo Kasei) was used instead of 4,4',4"-triiodotriphenylamine and 1.0 g of N,N'-diphenylbendizine (supplied by Hiroshima Wako Junyaku) instead of N-(3-tolyl)-N-phenylamine (supplied by Aldrich) to obtain 0.37 g of a pale yellow powder. This was designated NPD-1.

This was further purified by sublimation twice under conditions of a boat temperature of 320° C. and $10^{-5}$ torr to obtain 0.31 g of a pale yellow powder. This was designated NPD-2.

PRODUCTION EXAMPLE 4

Production of a Dopant:

As a dopant, 4,4'-bis-[2-[4-(N,N-diphenylamino)phenyl-1-yl]-vinyl-1-yl]-1,1'-biphenyl (hereinafter abbreviated as DPAVBi) was produced.

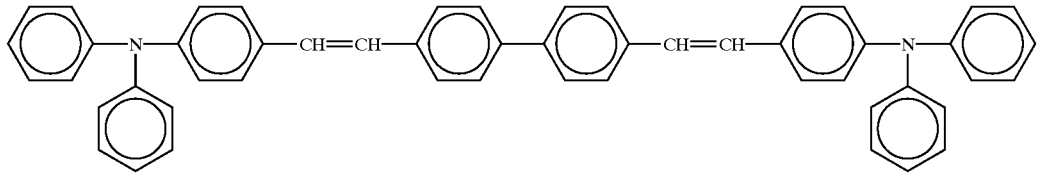

A 200-milliliter three-necked flask was charged with 1.9 g of phosphonic acid ester used in Production Example 1 and 3.0 g of N,N-diphenyl-4-aminobenzaldehyde, and the mixture was dissolved in 50 milliliters of dimethyl sulfoxide dried with a molecular sieve. While this was stirred with a magnetic stirrer in an atmosphere of an argon gas at room temperature, 1.0 g of potassium t-butoxide (supplied by Kanto Kagaku) was added in small portions in the state of a powder. The reaction solution immediately showed a reddish black color, and the color was soon faded to provide a precipitate which showed a greenish yellow color and then a yellowish brown color.

After the completion of the reaction, the stirring was further conducted at room temperature for 3 hours. This reaction product was allowed to stand overnight at room temperature. Then, 50 milliliters of a 80% by weight methanol aqueous solution was gradually added. Thereafter, a yellow precipitate formed was collected by filtration, and washed twice with 50 milliliters of a 80% by weight methanol aqueous solution and further twice with 50 milliliters of methanol. This was vacuum-dried at 50° C. for 3 hours to obtain 2.8 g of a yellow powder.

Subsequently, the yellow powder was eluted with toluene by chromatography on a column filled with 140 g of silica gel (trade name BW-820 MH, supplied by Fuji Devison Kagaku) in toluene, and a fraction eluted first was collected. Incidentally, in thin-film chromatography (elution solvent toluene:n-hexane=2:1 (volume ratio), silica gel thin layer) at this time, a rate of flow Rf was 0.8.

Then, a fraction containing a desired product was collected, and the solvent was evaporated to dryness with an evaporator. And, the thus-obtained yellow powder was heat-dissolved in 60 milliliters of toluene, and an insoluble product was filtered through a membrane filter (supplied by ADVANTEC, 1 μm, 25 mm).

This toluene solution was allowed to stand at room temperature. The resulting precipitate was collected by filtration, and dried at 50° C. for 2 hours to obtain 2.3 g of a yellow powder. This was designated DPAVBi-1.

This was further heat-dissolved in 50 milliliters of toluene once again, and recrystallization was repeated three times. As a result, 1.6 g of a yellow powder was obtained. This was designated DPAVBi-2.

PRODUCTION EXAMPLE 5

Purification of an Electron Transport Material:

As an electron transport material, aluminum-tris(8-hydroxyquinolinol) (hereinafter abbreviated as Alq) having the following structure which is supplied by Dojin Kagaku was used.

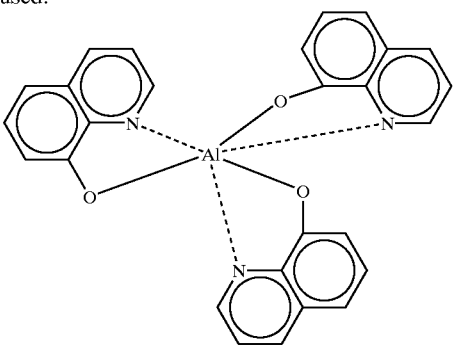

One gram of Alq (designated Alq-1) supplied by Dojin Kagaku was purified by sublimation twice under conditions of a boat temperature of 300° C. and $10^{-5}$ torr to obtain 0.7 g of a yellow powder. This was designated Alq-2.

The compounds obtained in Production Examples 1 to 5 were analyzed by GPC according to the method described in the text of the specification, and a ratio of a main peak area to a total peak area was measured. The results are shown in Table 1.

TABLE 1

| Sample's name | Ratio of a main peak area to a total peak area in the analysis by GPC (%) |
|---|---|
| DPVTP-1 | 98.0 |
| DPVTP-2 | 100.0 |
| DPAVBi-1 | 98.5 |
| DPAVBi-2 | 99.7 |
| MTDATA-1 | 97.8 |
| MTDATA-2 | 99.9 |
| NPD-1 | 98.3 |
| NPD-2 | 100.0 |
| Alq-1 | 96.8 |
| Alq-2 | 100.0 |

EXAMPLE 1

An indium-tin-oxide film (In-Si-O film, hereinafter abbreviated as ITO film) (corresponding to an anode) having a thickness of 100 nm was formed on a glass substrate of 25 mm×75 mm×1.1 mm by a deposition method, and this was used as a transparent support substrate. This transparent support substrate was ultrasonically cleaned with isopropyl alcohol for 5 minutes, further ultrasonically cleaned in pure water for 5 minutes, and then cleaned at a substrate temperature of 150° C. for 20 minutes using a UV ion cleaner (supplied by Samco International Co., Ltd.).

This transparent support substrate was dried with a dry nitrogen gas, and fixed on a substrate holder of a commercial deposition device (supplied by Nippon Shinku Gijutsu). Further, this commercial deposition device was provided with plural molybdenum resistance-heating boats. The independent resistance-heating boats were charged with 200 mg of MTDATA-1, 200 mg OF NPD-1, 200 mg OF DPVTP-2, 200 mg of DPAVBi-1 and 200 mg of Alq-1 respectively. These were used as organic compounds for deposition.

At this time, distances between the resistance-heating boats and the substrate were MTDATA-1: 20 cm, NPD-1:25 cm, DPVTP-2: 25 cm, DPAVBi-1: 20 cm and Alq-1: 25 cm.

After the organic compounds for deposition were charged into the resistance-heating boats, a pressure of a vacuum tank was reduced to $4\times10^{-6}$ torr, and an electric current was passed through the heating boat charged with MTDATA-1 to conduct heating to 360° C. The compound was deposited on the transparent support substrate at a deposition rate of 1 to 3 Å/sec to provide a 60 nm-thick MTDATA-1 layer.

And, an electric current was passed through the heating boat charged with NPD-1 to conduct heating to 260° C. NPD-1 was deposited on the MTDATA-1 layer at a deposition rate of 1 to 3 Å/sec to provide an NPD-1 layer having a film thickness of 20 nm.

Subsequently, an electric current was passed through the heating boat charged with DPVTP-2 and the heating boat charged with DPAVBi-1 at the same time to form a emitting layer comprising DPVTP-2 and DPAVBi-1 and having a film thickness of 40 nm. At this time, the deposition rates were 28 to 30 Å/sec in case of DPVTP-2 and 1 to 1.3 Å/sec in case of DPAVBi-1.

Further, an electric current was passed through the heating boat charged with Alq-1, and an Alq-1 layer was deposited on the emitting layer at a deposition rate of 1 to 3 Å to form an Alq-1 layer having a film thickness of 20 nm.

Then, this was withdrawn from the vacuum tank, and a mask made of stainless steel was placed on the electron transport layer. The product was fixed on the substrate holder once again. Subsequently, an alloy base material comprising aluminum and lithium (Al—Li) and having a lithium concentration of 5 atom % was used as a deposition material for forming a cathode, and deposited under conditions that a degree of vacuum in deposition was $1\times10^{-6}$ torr and a deposition rate was between 5 and 10 Å/sec to form a cathode having a film thickness of 150 nm.

A DC voltage of 6 V was applied to the above-obtained organic EL element by rendering an ITO electrode positive and an Al—Li alloy electrode negative. Then, uniform blue luminescence was obtained. The half-life (time that lapsed until an initial luminance of 300 cd/m$^2$ was decreased to 150 cd/m$^2$) of this organic EL element was measured by the driving with a constant current in a nitrogen stream. The half-life of this organic EL element was shown in Table 2.

Meanwhile, separately, each of organic compound layers (hole injection layer, hole transport layer, emitting layer and electron transport layer) was formed on each of transparent support substrates in the above-mentioned manner. Then, each organic compound layer on each transparent support substrate was dissolved in an organic solvent such as toluene or the like. The mass spectrum of each solution was measured by FD-MS according to the method described in the test of the specification, and the IR value and the ΔM value were measured. The results are shown in Table 2.

EXAMPLE 2

An organic EL element was produced in the same manner as in Example 1 except that DPVTP-2 was changed to DPVTP-1 and MTDATA-1 to MTDATA-2 in Example 1. A DC voltage of 6 V was applied to the resulting organic EL element by rendering an ITO electrode positive and an Al—Li alloy electrode negative. Then, uniform blue luminescence was obtained. The half-life of this organic EL element was shown in Table 2.

Further, the IR value and the ΔM value of each organic compound layer were measured as in Example 1. The results are shown in Table 2.

EXAMPLE 3

An organic EL element was produced in the same manner as in Example 1 except that DPVTP-2 was changed to DPVTP-1 and NPD-1 to NPD-2 in Example 1. A DC voltage of 6 V was applied to the resulting organic EL element by rendering an ITO electrode positive and an Al—Li alloy electrode negative. Then, uniform blue luminescence was obtained. The half-life of this organic EL element was shown in Table 2.

Further, the IR value and the ΔM value of each organic compound layer were measured as in Example 1. The results are shown in Table 2.

EXAMPLE 4

An organic EL element was produced in the same manner as in Example 1 except that DPVTP-2 was changed to DPVTP-1 and DPAVBi-1 to DPAVBi-2 in Example 1. A DC voltage of 6 V was applied to the resulting organic EL element by rendering an ITO electrode positive and an Al—Li alloy electrode negative. Then, uniform blue luminescence was obtained. The half-life of this organic EL element was shown in Table 2.

Further, the IR value and the ΔM value of each organic compound layer were measured as in Example 1. The results are shown in Table 2.

EXAMPLE 5

An organic EL element was produced in the same manner as in Example 1 except that DPVTP-2 was changed to DPVTP-1 and Alq-1 to Alq-2 in Example 1. A DC voltage of 6 V was applied to the resulting organic EL element by rendering an ITO electrode positive and an Al—Li alloy electrode negative. Then, uniform blue luminescence was obtained. The half-life of this organic EL element was shown in Table 2.

Further, the IR value and the ΔM value of each organic compound layer were measured as in Example 1. The results are shown in Table 2.

EXAMPLE 6

An organic EL element was produced in the same manner as in Example 1 except that MTDATA-1 was changed to MTDATA-2, NPD-1 to NPD-2, DPAVBi-1 to DPAVBi-2 and Alg-1 to Alg-2 in Example 1. A DC voltage of 6 V was applied to the resulting organic EL element by rendering an ITO electrode positive and an Al—Li alloy electrode negative. Then, uniform blue luminescence was obtained. The half-life of this organic EL element was shown in Table 2.

Further, the IR value and the ΔM value of each organic compound layer were measured as in Example 1. The results are shown in Table 2.

COMPARATIVE EXAMPLE-1

An organic EL element was produced in the same manner as in Example 1 except that DPVTP-2 was changed to DPVTP-1 in Example 1. A DC voltage of 6 V was applied to the resulting organic EL element by rendering an ITO electrode positive and an Al—Li alloy electrode negative. Then, uniform blue luminescence was obtained. The half-life of this organic EL element was shown in Table 2.

Further, the IR value and the ΔM value of each organic compound layer were measured as in Example 1. The results are shown in Table 2.

COMPARATIVE EXAMPLE 2

An organic EL element was produced in the same manner as in Example 1 except that the pressure of the vacuum tank was reduced to $6\times10^{-5}$ torr instead of to $4\times10^{-6}$ torr. A DC voltage of 6 V was applied to the resulting organic EL element by rendering an ITO electrode positive and an Al—Li alloy electrode negative. Then, uniform blue luminescence was obtained. The half-life of this organic EL element was shown in Table 2.

Further, the IR value and the ΔM value of each organic compound layer were measured as in Example 1. The results are shown in Table 2.

TABLE 2-1

| | Degree of vacuum (torr) | Hole injection material | Hole transport material | Emitting material | Dopant | Electron transport material |
|---|---|---|---|---|---|---|
| Example 1 | $4 \times 10^{-6}$ | MTDATA-1 | NPD-1 | DPVTP-2 | DPAVBi-1 | Alq-1 |
| Example 2 | $4 \times 10^{-6}$ | MTDATA-2 | NPD-1 | DPVTP-1 | DPAVBi-1 | Alq-1 |
| Example 3 | $4 \times 10^{-6}$ | MTDATA-1 | NPD-2 | DPVTP-1 | DPAVBi-1 | Alq-1 |
| Example 4 | $4 \times 10^{-6}$ | MTDATA-1 | NPD-1 | DPVTP-1 | DPAVBi-2 | Alq-1 |
| Example 5 | $4 \times 10^{-6}$ | MTDATA-1 | NPD-1 | DPVTP-1 | DPAVBi-1 | Alq-2 |
| Example 6 | $4 \times 10^{-6}$ | MTDATA-2 | NPD-2 | DPVTP-2 | DPAVBi-2 | Alq-2 |
| Comparative Example 1 | $4 \times 10^{-6}$ | MTDATA-1 | NPD-1 | DPVTP-1 | DPAVBi-1 | Alq-1 |
| Comparative Example 2 | $6 \times 10^{-5}$ | MTDATA-1 | NPD-1 | DPVTP-2 | DPAVBi-1 | Alq-1 |

[Notes]

| | Distance to substrate (cm) | Rate of deposition (Å/sec) |
|---|---|---|
| MTDATA-1, 2 | 20 | 1–3 |
| NPD-1, 2 | 25 | 1–3 |
| DPVTP-1, 2 | 25 | 4–8 |
| DPAVBi-1, 2 | 20 | 0.1–0.2 |
| Alq-1, 2 | 25 | 1–3 |

TABLE 2-2

| | Hole injection layer | | Hole transport layer | | Emitting layer | | Electron transport layer | | Half-life (hrs.) |
|---|---|---|---|---|---|---|---|---|---|
| | IR value | ΔM value | IR value | ΔM value | IR value | ΔM value | IR value | ΔM value | |
| Example 1 | 10 | 32 | 5 | 32 | 2 | 32 | 2 | 27 | 5200 |
| Example 2 | 5 | 32 | 5 | 32 | 5 | 32 | 2 | 27 | 4700 |
| Example 3 | 10 | 32 | 5 | 32 | 5 | 32 | 2 | 27 | 4900 |
| Example 4 | 10 | 32 | 5 | 32 | 5 | 32 | 2 | 27 | 4200 |
| Example 5 | 10 | 32 | 5 | 32 | 5 | 32 | 1 | 27 | 4600 |
| Example 6 | 5 | 32 | 2 | 32 | 2 | 32 | 1 | 27 | 6000 |
| Comparative Example 1 | 10 | 32 | 5 | 32 | 5 | 32 | 2 | 27 | 1800 |
| Comparative Example 2 | 30 | 32 | 25 | 32 | 10 | 32 | 5 | 27 | 1500 |

EXAMPLE 7

An ITO film having a thickness of 100 nm was formed on a glass substrate of 25 mm×75 mm×1.1 mm by a deposition method, and this was used as a transparent support substrate. This transparent support substrate was ultrasonically cleaned with isopropyl alcohol for 5 minutes, further ultrasonically cleaned in pure water for 5 minutes, and then finally cleaned ultrasonically with isopropyl alcohol again for 5 minutes. This transparent support substrate was then fixed on a substrate holder of a commercial deposition device (supplied by Nippon Shinku Gijutsu). This commercial deposition device was provided with plural molybdenum resistance-heating boats. The independent resistance-heating boats were charged with 200 mg of MTDATA as a hole injection material, 200 mg OF NPD as a hole transport material, 200 mg of the following compound 1 as a emitting material and 200 mg of Alq as an electron transport material respectively. These were used as organic compounds for deposition.

Compound 1

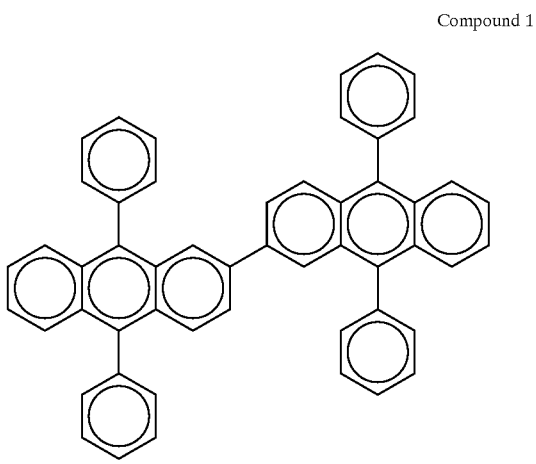

MTDATA, NPD, compound 1 and Alq were analyzed by GPC, and a ratio of a main peak area to a total peak area was measured. The results were 99.9%, 100%, 99.2% and 100% respectively.

After the organic compounds for deposition were charged into the resistance-heating boats, a pressure of a vacuum tank was reduced to $1 \times 10^{-6}$ torr, and an electric current was passed through the heating boat charged with MTDATA to conduct heating to 360° C. The compound was deposited on the transparent support substrate at a deposition rate of 1 to 3 Å/sec to provide a 60 nm-thick MTDATA layer.

And, an electric current was passed through the heating boat charged with NPD to conduct heating to 260° C. NPD was deposited on the MTDATA layer at a deposition rate of 1 to 3 ÅA/sec to provide an NPD layer having a film thickness of 20 nm.

Subsequently, an electric current was passed through the heating boat charged with compound 1, and heat-evaporation was conducted to form a emitting layer having a film thickness of 40 nm. Further, an electric current was passed through the heating boat charged with Alq to form an Alq layer having a film thickness of 20 nm.

Then, this was withdrawn from the vacuum tank, and a mask made of stainless steel was placed thereon. The product was fixed on the substrate holder once again. Subsequently, Mg and Ag were deposited with a degree of vacuum of $1 \times 10^{-6}$ torr to form an Mg:Ag film having a film thickness of 150 nm to obtain an organic EL element.

A voltage of 6 V was applied to the above-obtained element by using the ITO film as an anode and the Mg:Ag film as a cathode to conduct a luminescence test. Then, uniform bluish green luminescence was obtained. The initial properties were that at the applied voltage of 6 V, a current density was 10 mA/cm$^2$ and a luminance was 100 cd/m$^2$. When this element was driven with a constant current in a nitrogen stream at an initial luminance of 100 cd/m$^2$, the half-life in which the luminance became 50 cd/m$^2$ was 100 hours or more. Subsequently, the emitting layer was subjected to mass spectrometry. Consequently, the oxidized (+32) FD-MS peak intensity was 5% or less relative to the unoxidized peak intensity.

Further, the IR value and the ΔM value of each organic compound layer were measured as in Example 1. The results are shown in Table 3.

COMPARATIVE EXAMPLE 3

An organic EL element was produced as in Example 7 except that the degree of vacuum in the deposition of the emitting material (compound 1) was changed to $1 \times 10^{-5}$ torr. Further, the resulting organic EL element was subjected to a luminescence test. Consequently, no remarkable difference was observed in the initial properties, but the half-life was only 10 hours. Subsequently, the emitting layer was subjected to mass spectrometry. As a result, the oxidized (+32) FD-MS peak intensity was 28% relative to the unoxidized peak intensity. It is considered that since the oxidized compounds was thus incorporated at the high ratio, the half-life was decreased as compared with that of the organic EL element in Example 7.

Further, the IR value and the ΔM value of each organic compound layer were measured as in Example 1. The results are shown in Table 3.

EXAMPLE 8

An organic EL element was produced in the same manner as in Example 7 except that the following compound 2 was used as a emitting material.

Compound 2

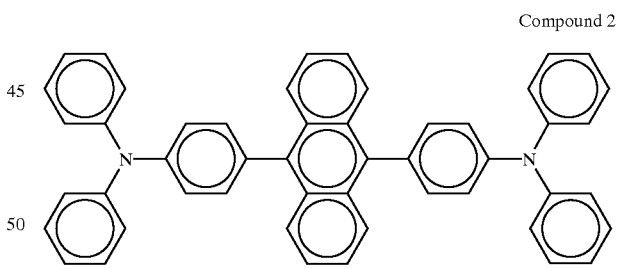

The compound 2 was analyzed by GPC, and a ratio of a main peak area to a total peak area was measured, and found to be 98.9%.

The resulting organic EL element was subjected to a luminescence test. Consequently, uniform blue luminescence was obtained having the initial properties that at an applied voltage of 5 V, a current density was 10 mA/cm$^2$ and a luminance was 150 cd/m$^2$. When this element was driven with a constant current in a nitrogen stream at an initial luminance of 100 cd/$^2$ the half-life in which the luminance became 50 cd/m$^2$ was 100 hours or more. Subsequently, the emitting layer was subjected to mass spectrometry. Consequently, the oxidized (+32) FD-MS peak intensity was 5% or less relative to the unoxidized peak intensity.

Further, the IR value and the ΔM value of each organic compound layer were measured as in Example 1. The results are shown in Table 3.

COMPARATIVE EXAMPLE 4

An organic EL element was produced in the same manner as in Example 8 except that the deposition temperature of the compound 2 as the emitting material was set at a temperature which was 50° C. higher than the melting point and the deposition rate was increased. The resulting organic EL element was subjected to a luminescence test. Consequently, white luminescence was obtained having the initial properties that at an applied voltage of 5 V, a current density was 12 mA/cm$^2$ and a luminance was 70 cd/m$^2$. When this element was driven with a constant current in a nitrogen stream at an initial luminance of 100 cd/m$^2$, the half-life in which the luminance became 50 cd/m$^2$ was 2 hours. Subsequently, the emitting layer was subjected to mass spectrometry. Consequently, the oxidized (+32) FD-MS peak intensity was 35% or more relative to the unoxidized peak intensity. It is considered that since the oxidized compound was thus incorporated at the high ratio, the emitting color was changed from blue to white and the emitting efficiency and the half-life were decreased as compared with the organic EL element in Example 8.

Further, the IR value and the ΔM value of each organic compound layer were measured as in Example 1. The results are shown in Table 3.

COMPARATIVE EXAMPLE 5

An organic EL element was produced in the same manner as in Example 8 except that a compound containing 40% (FD-MS peak intensity ratio) of an oxidized compound from the beginning was used as compound 2 being a emitting material. The resulting organic EL element was subjected to a luminescence test. Consequently, white luminescence was observed as in Comparative Example 4, and the half-life was also much reduced to 1.5 hours.

Further, the IR value and the ΔM value of each organic compound layer were measured as in Example 1. The results are shown in Table 3.

EXAMPLE 9

An organic EL element was produced in the same manner as in Example 7 except that the following compound 3 was used as a emitting material.

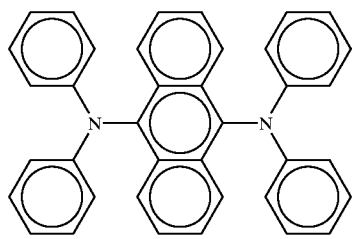

Compound 3

The compound 3 was analyzed by GPC, and a ratio of a main peak area to a total peak area was measured, and found to be 99.1%.

The resulting organic EL element was subjected to a luminescence test. Consequently, uniform green luminescence was obtained having the initial properties that at an applied voltage of 5 V, a current density was 10 mA/cm$^2$ and a luminance was 100 cd/m$^2$. When this element was driven with a constant current in a nitrogen stream at an initial luminance of 100 cd/m$^2$, the half-life in which the luminance became 50 cd/m$^2$ was 100 hours or more. Subsequently, the emitting layer was subjected to mass spectrometry. Consequently, the oxidized (+32) FD-MS peak intensity was 5% or less relative to the unoxidized peak intensity.

Further, the IR value and the ΔM value of each organic compound layer were measured as in Example 1. The results are shown in Table 3.

COMPARATIVE EXAMPLE 6

An organic EL element was produced in the same manner as in Example 9 except that the deposition temperature of the compound 3 as the emitting material was set at a temperature which was 50° C. higher than the melting point and the deposition rate was increased. The resulting organic EL element was subjected to a luminescence test. Consequently, as in Comparative Example 4, white luminescence was observed, and the half-life was notably decreased to 1 hour. Subsequently, the emitting layer was subjected to mass spectrometry. Consequently, the oxidized (+32) FD-MS peak intensity was 35% or more relative to the unoxidized peak intensity.

Further, the IR value and the ΔM value of each organic compound layer were measured as in Example 1. The results are shown in Table 3.

TABLE 3

| | Hole injection layer (MTDATA) | | Hole transport layer (NDP) | | Emitting layer | | | Electron transport layer (Alq) | |
|---|---|---|---|---|---|---|---|---|---|
| | IR value | ΔM value | IR value | ΔM value | Type | IR value | ΔM value | IR value | ΔM value |
| Example 7 | 10 | 32 | 5 | 32 | Compound 1 | 5 | 32 | 1 | 27 |
| Example 8 | 10 | 32 | 5 | 32 | Compound 2 | 5 | 32 | 1 | 27 |
| Example 9 | 10 | 32 | 5 | 32 | Compound 3 | 5 | 32 | 1 | 27 |
| Comparative Example 3 | 10 | 32 | 5 | 32 | Compound 1 | 28 | 32 | 1 | 27 |
| Comparative Example 4 | 10 | 32 | 5 | 32 | Compound 2 | 35 | 32 | 1 | 27 |
| Comparative Example 5 | 10 | 32 | 5 | 32 | Compound 2 | 31 | 32 | 1 | 27 |
| Comparative Example 6 | 10 | 32 | 5 | 32 | Compound 3 | 35 | 32 | 1 | 27 |

As stated above, when the compounds containing the anthracene structure, the naphthacene structure, the pyrene structure or the perylene structure are used as a compound constituting the organic EL element, there is a possibility that oxidized compounds are easily incorporated depending on a powdery state or deposition conditions (degree of vacuum, temperature and deposition rate). Controlling the contents of the oxidized compound is quite important to improve the performance of the organic EL element.

Industrial Applicability

As stated above, according to the present invention, the organic EL element of the present invention is a practical element which is excellent in a durability without decreasing a luminance even in the driving for a long period of time. It is appropriately used in, for example, a display of information appliances or the like.

What is claimed is:

1. An organic electroluminescence element in which an organic compound layer having at least an organic emitting layer is held between a pair of electrodes, an anode and a cathode, wherein at least one layer of the organic compound layer includes an organic compound containing at least one of an anthracene structure, a naphthacene structure, a pyrene structure and a perylene structure in the skeleton structure, and wherein summation of the intensity of peaks, each being attributable to an oxidized compound of the organic compound in the mass spectrum is 25% or less of the intensity of peak for the organic compound, the oxidized compound being detected as +16 and +32 components in the mass spectrum.

2. A process for producing an organic electroluminescence element in which an organic compound layer having at least an organic emitting layer is held between a pair of electrodes, an anode and a cathode, wherein at least one layer of the organic compound layer is an organic compound containing at least one of an anthracene structure, a naphthacene structure, a pyrene structure and a perylene structure in the skeleton structure, and wherein summation of the intensity of peaks, each being attributable to an oxidized compound of the organic compound in the mass spectrum is 25% or less of the intensity of peak for the organic compound, the oxidized compound being detected as +16 and +32 components in the mass spectrum, wherein the organic compound layer is formed by deposition.

3. The process as claimed in claim 2, wherein a degree of vacuum in the deposition is between $10^{-5}$ and $10^{-7}$ torr.

4. The process as claimed in claim 2, wherein a deposition rate is between 0.1 and 40 Å/sec.

* * * * *

UNITED STATES PATENT AND TRADEMARK OFFICE
CERTIFICATE OF CORRECTION

PATENT NO.    : 6,531,234 B1
DATED         : March 11, 2003
INVENTOR(S)   : Higashi et al.

It is certified that error appears in the above-identified patent and that said Letters Patent is hereby corrected as shown below:

<u>Title page,</u>
Item [22] should read -- [22] PCT Filed:    Jul. 15, 1999 --

Signed and Sealed this

Seventh Day of June, 2005

JON W. DUDAS
*Director of the United States Patent and Trademark Office*